(12) United States Patent
Harris

(10) Patent No.: US 7,923,173 B1
(45) Date of Patent: Apr. 12, 2011

(54) PHOTO DEFINABLE POLYIMIDE FILM USED AS AN EMBOSSING SURFACE

(75) Inventor: Ken Harris, Las Cruces, NM (US)

(73) Assignee: Illinois Tool Works Inc., Glenview, IL (US)

( * ) Notice: Subject to any disclaimer, the term of this patent is extended or adjusted under 35 U.S.C. 154(b) by 1730 days.

(21) Appl. No.: 09/692,075

(22) Filed: Oct. 19, 2000

(51) Int. Cl.
*G03F 7/00* (2006.01)

(52) U.S. Cl. ............... 430/1; 430/2; 430/321; 264/1.31; 359/3

(58) Field of Classification Search ............ 430/1, 2, 430/300, 306, 307; 359/3; 264/1.31
See application file for complete search history.

(56) References Cited

U.S. PATENT DOCUMENTS

| | | | |
|---|---|---|---|
| 4,054,635 A * | 10/1977 | Schlesinger et al. | 264/219 |
| 4,256,793 A | 3/1981 | Cannady, Jr. et al. | 428/137 |
| 4,384,011 A | 5/1983 | Aoyama et al. | 427/54.1 |
| 4,446,222 A | 5/1984 | Kress | 430/307 |
| 4,558,117 A * | 12/1985 | Nakno et al. | 430/283.1 |
| 4,927,736 A * | 5/1990 | Mueller et al. | 430/275.1 |
| 4,999,234 A | 3/1991 | Cowan | 428/156 |
| 5,004,521 A | 4/1991 | Makino | 156/645 |
| 5,104,768 A * | 4/1992 | Sassmannshausen et al. | 430/192 |
| 5,149,607 A * | 9/1992 | De Graaf et al. | 430/321 |
| 5,279,689 A * | 1/1994 | Shvartsman | 264/1.4 |
| 5,281,511 A | 1/1994 | Gerhart | 430/320 |
| 5,331,543 A | 7/1994 | Yajima et al. | |
| 5,374,469 A * | 12/1994 | Hino et al. | 428/209 |
| 5,452,282 A * | 9/1995 | Abraham | 430/1 |
| 5,521,030 A | 5/1996 | McGrew | 430/1 |
| 5,576,636 A | 11/1996 | Baucom | |
| 5,822,092 A | 10/1998 | Davis | 359/10 |
| 6,010,825 A * | 1/2000 | Hagen et al. | 430/283.1 |
| 6,324,329 B1 * | 11/2001 | Mizuno | 385/131 |
| 6,549,309 B1 | 4/2003 | Monaghan et al. | |
| 2001/0048594 A1 | 12/2001 | Murase et al. | |

FOREIGN PATENT DOCUMENTS

| | | | |
|---|---|---|---|
| CA | 2034542 A1 | | 7/1991 |
| EP | 0574934 A1 | | 12/1993 |
| EP | 0766142 | * | 4/1997 |
| JP | 59-123836 | * | 7/1984 |
| JP | 63108374 | | 5/1988 |
| JP | 01-142077 | * | 6/1989 |
| JP | 4003168 | | 1/1992 |
| JP | 4241352 | | 8/1992 |
| JP | 6143294 | | 5/1994 |
| JP | 08-039572 | * | 2/1996 |
| JP | 9222514 | | 8/1997 |
| JP | 2000199949 | | 7/2000 |

(Continued)

OTHER PUBLICATIONS

IBM Technical Disclosure Bulletin vol. 30(3) pp. 1392-1393 (Aug. 1987).*

(Continued)

*Primary Examiner* — Martin J Angebranndt
(74) *Attorney, Agent, or Firm* — Houston Eliseeva, LLP

(57) ABSTRACT

An embossing surface and a method for creating that surface is provided by a polyimide material which has photodefinable characteristics. One benefit is that the embossing surfaces do not have to be made by data transfer from the photo-definable surface. The polyimide material is cured by heating to a predetermined hardness appropriate for the surfaces to be embossed.

16 Claims, 1 Drawing Sheet

COATING ROLLER

FOREIGN PATENT DOCUMENTS

| | | |
|---|---|---|
| JP | 2000202917 | 7/2000 |
| JP | 2000343031 | 12/2000 |
| JP | 2001091750 | 4/2001 |
| JP | 2001255657 | 9/2001 |
| WO | 94/26957 A1 | 11/1994 |
| WO | WO 96/30184 | 10/1996 |

OTHER PUBLICATIONS

Machine translation of JP 08-039572, (Feb. 1996).*

HD MicroSystems Technical Information: *Preliminary Product Bulletin, Photodefinable HD-8000 Series Positive Tone, Aqueous Developable Polyimide* (19 pages), (2000).

Technical Information: HD Microsystems Product Technology (11 pages) (Aug. 14, 2000).

Horigome, Shinkichi, et al., "Novel Stamper Process for Optical Disc" Optical Storage Technology and Applications, Los Angeles, Jan. 12-15, 1988, Proceedings of SPIE, vol. 899, Jan. 1988, XP000010872.

* cited by examiner

COATING ROLLER

PRE-CURE

DIRECT WRITE DOT MATRIX

HARDING POST CURE

PHOTO DEFINABLE POLYIMIDE FILM USED AS AN EMBOSSING SURFACE

TECHNICAL FIELD

The present invention relates generally to the field of embossing photo-profiled data. In particular, the present invention is directed to a material and a method for using the subject material to eliminate steps between photo-profiling and embossing.

BACKGROUND ART

Embossing tools are used in a wide variety of applications for transferring data from one medium to another. One example is the mass production of holograms, using embossing tools, for the holographic portions of credit cards. Holograms are also created for a large number of other products, including periodical advertising, wrapping paper and other decorations, a wide range security devices, packaging, and artwork. Mass production of such holograms is carried out by impressing a film with an embossing die containing the holographic relief pattern.

The embossing die or tool is the key feature of this process, and requires a high degree of precision in its manufacturing in order to successfully generate large quantities of high quality holograms. Conventionally, such tools are produced using a number of steps. The first step involves a photoresisted plate exposed to a holographic interference pattern used to form the "master" hologram. After exposure to the holographic light pattern, the photoresist is developed to form a surface-relief pattern in the photoresist corresponding to the holographic interference pattern.

Then a thin layer of nickel is electroformed onto the relief surface of the photoresist to transfer the interference pattern. The nickel layer is then peeled away from the photoresist. This nickel layer becomes the master, and a second nickel layer is made as a copy of the first. The second nickel layer servers as the stamper, and is clamped to a substrate, either by being wrapped around the cylinder or being held to a flat plate which forms a die. Each of the layers is known as a shim. Generally there are two shims used, with one being kept aside as a master while the other is used as a stamper. The metal die is then used to stamp or press the transparent film, impressing the holographic interference pattern onto the film, thereby creating the production holograms. This process is used for a wide variety of different types of holograms, including those constituted by translucent films viewed with laser light, defraction patterns, "2D 3D" holograms, and virtually any other holographic pattern that lends itself to mass production.

Unfortunately, there are certain limitations to such conventional techniques. For example, nickel is the preferred metal for creating an embossing tool to transfer the holographic interference pattern. Accordingly, only material softer than nickel can be imprinted by the die. For example, nickel can be used for imprinting on polyester films, soft plastics and the like. However, even with such soft material nickel deforms after continuous use so that after a few thousand meters of embossing, the embossing tool deteriorates to the point that it is no longer suitable for turning out copies.

Also, when a die is wrapped around a printing cylinder or roller, a seam runs approximately parallel to the axis of the cylinder. For the sake of accuracy, the holographic pattern cannot be located anywhere near the seam. In particularly large printing cylinders, multiple shims are used since it is often very difficult to make shims large enough for some embossing rollers. The chief problem with this situation is that there is a mark in the material every time that this seam comes around as a result of the rotation of the roller. As a result, a good deal of the roller surface is lost for practical use, and the size of the hologram that can be printed is severely limited. Since it is very difficult to make a solid cylindrical roller by a metal deposition process, such as electroplating, this problem probably cannot be solved using conventional techniques, which are not adaptable to creating a seamless roller.

Other, harder materials have been tried in the production of embossing tools. For example, aluminum has been used for embossing dies for holographic transfer. However, the process for making the aluminum die is severely limited by the chemical etching process so that accuracy of the etched pattern degrades rapidly with increasing depth of the etching. Also, aluminum is not a particularly good material for extremely high pressures, such as those used in creating embossed holograms.

Other, harder materials have been used. For example ion milling or etching has been used to create holographic patterns on such materials as tool steel, diamond or chromium. One example of such a technique is found in U.S. Pat. No. 5,521,030 to McGrew. This patent discloses the use of anisotropic reactive-ion etching to transfer a holographic interference pattern from a photoresist to the durable material to be used as an embossing tool.

Unfortunately, such techniques for forming holographic interference patterns on durable materials are extremely expensive and complex to carry out. Such techniques are only justified when large numbers of accurate holograms have to be embossed. Otherwise, the expense of such techniques can not be justified. Further, none of the conventional techniques are capable of providing for seamless embossing, or any of the advantages associated therewith. Accordingly, there is still a need to inexpensively create embossing tools on hard material that can be used to transfer holographic interference patterns under conditions of high pressure without degrading the resultant copies, even for extended production runs.

SUMMARY OF THE INVENTION

Accordingly, it is a first object of the present invention to eliminate the drawbacks of conventional embossing of data.

It is a second object of the present invention to provide an embossing tool which avoids the limitation of conventional seams on embossing rollers.

It is another object of the present invention to streamline the embossing process when transferring photo-profilable data.

It is a further object of the present invention to decrease the expense of transferring photo-profilable data.

It is an additional object of the present invention to eliminate steps in conventional embossing of photo-profilable data.

It is still another object of the present invention to limit the number of materials used in an embossing operation for transferring photo-definable data and other materials.

It is yet a further object of the present invention to provide an embossing process in which the embossing surface can be selected from a wide variety of different hardnesses.

It is still a further object of the present invention to provide an easily manufactured embossing surface capable of enduring high pressure for extended production runs.

It is again another object of the present invention to provide an embossing system using a photo-profilable material having good selectivity.

It is still a further object of the present invention to provide an embossing system having a photo-profitable material that does not have to be etched.

It is again another further object of the present invention to provide an embossing system having a photo-profilable material with excellent cured filmed properties.

It is yet an additional object of the present invention to provide an embossing system using a photo definable material having high resolution and high exposure sensitivity.

It is again a further object of the present invention to provide an embossing system using a photo-profilable material and embossing surface as a single entity.

It is yet another object of the present invention to provide an embossing system having a positive acting photo-profilable material.

It is still another object of the present invention to provide an embossing system having a photo-profilable material that is capable of processing with positive resist developers, and provides positive tone.

It is again another object of the present invention to provide an embossing system in which the hardness of the embossing surface can be easily varied.

It is still an additional object of the present invention to provide photodefinable surface suitable for casting operations.

It is still a further object of the present invention to provide a photodefinable embellishment coating material.

It is again another object of the present invention to provide a photoprofilable data transfer material capable of transferring a wide range of holographic data, including those constituted by translucent films viewed with laser light, defraction patterns, "2D" "3D" stereograms, true "3D" holograms or virtually any other holographic pattern admitting to transfer.

It is still another object of the present invention to provide an embossing system whereby metallic elements can be eliminated.

It is yet another object of the present invention to provide an embossing system in which photodefinable material can be negative acting as well as positive acting, and can be developed by non-aqueous as well as aqueous solvents.

It is again a further object of the present invention to provide a data transfer system which uses a polyimide casting material.

These and other goals and objects of the present invention are provided by an embossing surface configured for transferring data to other surfaces, where the embossing surface consists of a photodefined polyimide material.

A second embodiment of the present invention is manifested by a method of embossing data from an embossing surface to other surfaces. The method consists of the steps of exposing a photodefinable material to EMF radiation defining the data. Afterwards, the photodefinable material is cured to achieve an embossing surface of a selected hardness. Finally, the embossing surface is used to emboss the data onto other surfaces.

DETAILED DESCRIPTION OF THE PREFERRED EMBODIMENTS

Figure 1A:
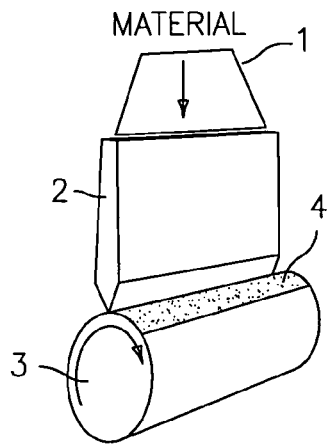
FIG. 1(a) is a perspective view depicting the transfer of polyimide material onto an embossing roller.

The present invention includes the use of a photodefinable or photoprofileable, positive-acting (positive tone) polyimide as an embossing surface. The polyimide is treated as depicted in FIGS. 1(a)-1(d), and as described infra for the purpose of the present invention. The polyimide material is placed on an appropriate surface, heat-treated, exposed to EMF radiation (such as coherent light), developed an hardened into an embossing surface. The embossing surface is used to transfer data expressed as the EMF radiation to another surface. This technique for using polyimide material is particularly effective for creating a holographic master to be used as an embossing surface.

Because of the characteristics of the polyimide material, it is also suitable for use as a gravure printing surface. Such a surface is created using photo detection techniques, and a flash application of metal to provide a printing surface. The positive photoresist characteristics of the polyimide material make this second embossing embodiment possible without the complications of conventional gravure printing processes, such as etching.

The polyimide material could be coated on virtually any surface, profiled, and then hardened to be used as a decorative or display surface. The use of such materials provides an advantage for artists since no material currently exists that can be easily formed, while still withstanding cleaning and ultraviolet radiation. Accordingly, the subject polyimide material can be used on any surface that could withstand the necessary curing temperatures.

The polyimide material can also be used in a casting operation to transfer the grooves of an existing hologram onto the polyimide material and the grooves in the polyimide material can be transferred into a casted material such as a plastic or other material that can be form by casting. The pattern from cast polyimide can be applied to other surfaces. Virtually any kind of casting technique can be used with the polyimide materials in the mold or as the mold. Examples of which are described infra.

The polyimides, which are applied to the novel uses in the instant application, are high temperature engineering polymers originally developed by the DuPont Company. When compared to most other organic or polymeric materials, polyimides exhibit an exceptional combination of thermal stability ($>500°$ C.), mechanical toughness and chemical resistance. In addition, they have excellent dielectric properties.

Conventionally polyimide films are frequently used as a "stress buffer" or protective overcoat for semiconductors. Polyimide stress buffers are typically 4-6 microns in thickness, and protect the delicate thin films of metal and oxides on the chip surface from damage during handling and from induced stress after encapsulation in plastic molding compound.

When used as a photo-definable material, patterning is simple and straightforward. Because of the low defect density and robust plasma etch resistance inherent with polyimide films, a "single mask" process can be implemented.

In the conventional fabrication of microelectronic devices, photodefinable polyimides are typically applied as a liquid onto a substrate, and then thermally cured into a smooth, rigid, intractable polymeric film or structural layer as further described, infra. The film can be patterned using a lithographic (photographic) process in conjunction with liquid photoresists. "Photodefinable" polyimides are light-sensitive and readily patterned without the use of photoresists, further simplifying the fabrication process.

For purposes of demonstrating the effectiveness of the present invention, the photodefinable, positive-acting polyimide selected is HD-8000, a product of HD Microsystems™, a joint enterprise with Hitachi Chemicals and DuPont Electronics. HD-8000 is a positive-tone, aqueous developing, photodefinable polyimide for stress buffer and chip bonding applications. HD-8000 includes a polyamic acid back-boned precursor that is synthesized by reacting aromatic dianhydrides with aromatic diamines. Also included are photosensitizers to provide positive tone lithographic properties during processing. Solvents are included as well. This material achieves pattern definition which greatly exceeds that of earlier-generation aqueous developing products.

The aforementioned polyimide material is positive tone or positive acting and can be developed with an aqueous solution. However, this is merely one example of the type of polyimide material that can be used with the present invention. For example, a negative tone or negative acting polyimide can also be used depending upon the exact implementation of data transfer to which the material will be put. Also, the polyimide material that is developed with non-aqueous solutions can be used for purposes of the present invention.

In FIG. 1(a) the polyimide material 1 is arranged using an applicator 2 on the moveable surface such as coating roller 3. The application of the polyimide material forms a coating 4 on the roller. It should be noted that while a roller is used in the example of FIG. 1(a), other surfaces can also be used for the application of polyimide material for photo defining and later embossing operations.

In most microelectronic applications polyimide coatings are typically spin applied to the substrate. This same process and basic tool set is also used to apply liquid photoresists. For optimal adhesion to silicon, oxides and most metals, adhesion promoters are required. Some polyimides have built in adhesion promoters, while others require the application of a separate adhesion promoter or coupler prior to polyimide application. Adhesion promoters are also applied by spin coating.

While spin coating assures the best uniformity and coating quality, other application techniques that have been used for applying polyimides include draw, spray, extrusion, roller, dip and drop coating.

While a rotating cylinder 3 has been used for coating 4, other shapes of embossing surfaces can also be used. For example, a flat surface can be used with a platen moved in two directions, or even a platen that moves in one direction while the source of EMF radiation is also moving in one or more directions.

It should be noted that the data to be transferred by means of the present invention can be expressed in a wide variety of different configurations. For example, holograms are of particular interest, and the transfer of holograms is easily facilitated by the present invention. Such holograms can include translucent films viewed with laser light, defraction patterns, "2D" "3D" stereograms, true "3D" holograms, as well as virtually any other holographic format for arrangement can be transferred using the present invention. It should be further noted that the present invention is not limited to the transfer of holographic material. Rather, virtually any other type of data that can be transferred by means of embossing can be quickly and accurately transferred using the system of the present invention.

Figure 1B:
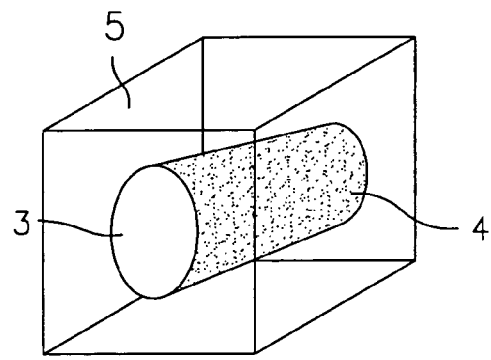
FIG. 1(b) is a perspective diagram depicting the precuring phase of the polyimide material.

In FIG. 1(b), the roller 3 with its polyimide coating 4 is placed in a curing oven 5. In the alternative, the coated substrate could be heated or soft; baked on hot plates at 120° C. for approximately 130-260 seconds. This is done for a target fixed thickness of 10 microns. However, different target thicknesses will require different baking times. After the pre-cure operation has altered the polyimide material 4 to a predetermined thickness and consistency, the polyimide material is ready for alteration or profiling by electromagnetic EMF radiation, such as light.

Coated substrates should be cooled to ambient temperature prior to EMF exposure. A chill plate is recommended for cooling after the heat treatment. For improved control, the wafers should be held for a minimum of 20 minutes prior to exposure. The coated substrates can be stored for up to 72 hours in a wafer cassette box under clean room conditions prior to exposure and development.

Figure 1C:
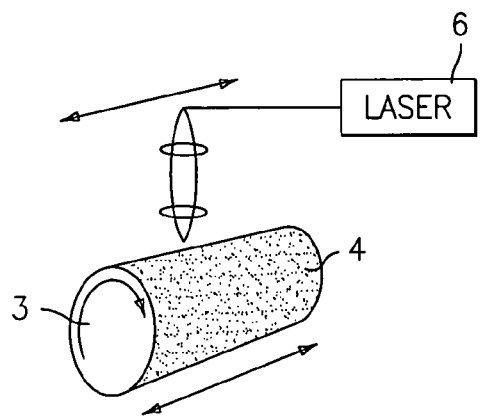
FIG. 1(c) is a perspective diagram depicting the photo defining of the polyimide material on the roller.
Figure 1D:
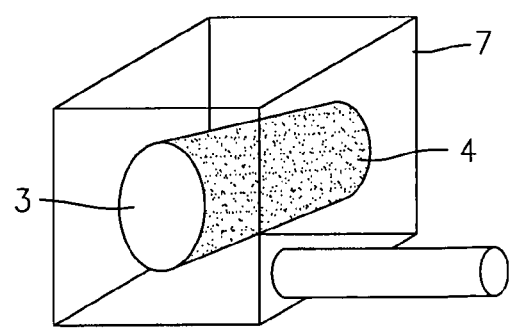
FIG. 1(d) is a perspective diagram depicting the hardening phase prior to embossing.

In FIG. 1(c) the light is monochromatic and provided by laser 6. It should be noted that while one preferred embodiment as depicted in FIG. 1(c), uses a laser light source, other forms of electromagnetic radiation can be used. Examples are: light having plural frequency elements, x-rays, radio waves, ultraviolet light, electron beams and infrared light. Photosensitive polyimides permit the patterning of relatively fine features. An aspect ratio of 1 to 1 can be achieved in fully cured films.

Data (from a source not shown) is expressed by the light from laser 6, and is used to profile or otherwise define or modify the polyimide coating 4 on roller 3. On example of such a photo defining technique is the pixel-by-pixel method disclosed in U.S. Pat. No. 5,822,092, to Davis issued Oct. 13, 1998, and incorporated herein by reference.

Part of the light profiling of the polyimide material 4 is the development of the material that has been exposed or otherwise profiled by the incident electromagnetic radiation, such as cohent light. In the preferred embodiment depicted in FIGS. 1(a)-1(d), a well-known type of aqueous solution is used to develop the exposed polyimide material. This can be carried out using a number of different techniques. For example, the entire roller 3 can be submerged in a bath (not shown). In the alternative, a developing chamber (not shown), similar to the heat treatment chambers, can be used to apply the developing solution. However, any other technique used for developing, using either aqueous or non-aqueous developing solutions are also suitable for the present invention. Any known combination of radiation exposure and development effective for any polyimide is suitable for the FIG. 1 (c) operation of photoprofiling of the polyimide material.

After being profiled by the light from laser 6, and developed, the polyimide coating 4, arranged on roller 3 is heat cured, for example in another oven 7. The curing takes place according to the parameters specified in the Preliminary Product Bulletin by HD Microsystems™, entitled *Photo Definable Image HD-8000 Series Positive Tone, Aqueous Developable Polyimide*, page 11, and summarized as follows.

Curing the polyimide film involves the removal of the solvent carrier or other volatiles from the layer and the imidization or hardening of the polymer into an intractable polyimide film. This curing process is typically done in steps. Hot plates or an oven are commonly used for the initial heat treatment or bake (FIG. 1(b)) after the polyimide application. The initial heat treatment can be performed at less then 150° C., desirably from 50° C. to 150° C. on one or more in-line hot plates or in the oven. A furnace or programmable oven is used for the final cure (FIG. 1(d)). Final curing is usually done between 280° C.-400° C., desirably about 350° C., depending on the application.

The final curing process should be performed under a nitrogen atmosphere (oxygen concentration <100 ppm), with or without a partial vacuum, and should follow the following steps: load the roller 3 with the polyimide coating 4 into oven 7 at <150° C.; increase the temperature to 350° C. over a 60 minute period; hold at 350° C. for 30 minutes; and, unload the roller 3 with the polyimide coating 4 from oven 7 either immediately or allow it to cool down first. It should be noted that the curing can also be done in an oven without the special atmosphere. The selection of oven atmosphere depends upon a number of factors, such as the size of the area of the polyimide to be cured, the thickness of the final polyimide coating, and other curing factors.

While one type of polyimide has been described, and proven to work, this is merely one example of the various photo-definable, polyimide materials that can be used to constitute the embossing system of the present invention. Further, such materials are particularly appropriate for transferring dot matrix holograms.

Based upon the aforementioned specification, the polyimide can be cured to a predetermined hardness and thickness on roller 3. Because the polyimide material forming layer 4 can be cured to a predetermined hardness, it is possible to use the polyimide surface 4 as an embossing surface. Consequently, the formation of a conventional metal embossing surface for transferring holograms is not necessary with the present invention. The result is a substantial saving of time and expense.

Because the polyimide used in the preferred embodiment can be used as a positive exposure substance, the material can also be used for gravure printing, in which the printed material is formed as depressions around unprofiled photoresist material. The ink is placed within the grooves that constitute the letters or the images, and the paper or other transfer surface is forced on the profiled surface so that the ink in the depressions is forced onto the transfer surface. The polyimide material is capable of being cured to a consistency that will handle the pressure handled for gravure printing operations. It should be noted that the roller 3 depicted in the drawings need not be used in this printing process. Rather, a flat platen can be used in the alternative. However, it should be noted that most printing takes place in roll presses so that roller 3 would most likely be the preferred surface for this type of system.

The use of polyimide for gravure printing requires a flash coating of a metal, such as nickel or chrome to be placed on the polyimide coating. However, the acid wash that is used in more conventional photodefining prepatory to gravure printing, is not necessary. As a result, the acid used in such washes will not degrade the metal defining the data to be transferred. Accordingly, the present invention avoids the loss of clarity or accuracy, as well as size limitations, inherent to conventional gravure printing systems. Accordingly, gravure printing using the polyimide in accordance with the present invention is carried out more easily and more cheaply than conventional systems, and results in a better product.

The polyimide material can be used in a cast or can be formed as a cast for the casting of other materials. The defraction grating being transferred in this way is present inside the cast as the material to be cast is poured in and then hardened to take the shape of the polyimide material and/or the relief of the defraction grating present in the cast. Once released from the cast, the object (for example a CD cover) will have the image present on the original object. In so doing, the benefits previously described with respect to the polyimide material are achieved for copies made from the polyimide casting.

While a number of embodiments have been described by way of example, the present invention is not limited thereby. Rather, the present invention should be interpreted to include any an all variations, modifications, permutations, adaptions, and embodiments that would occur to one skilled in this art once having been taught the invention. Therefore, the present invention is to be limited only by the following claims.

I claim:

1. A method of transferring data from a holographic master to another surface via a seamless transfer medium comprising a polyimide material, the method comprising the steps of:
   (a) providing the seamless transfer medium by casting the polyimide material on the holographic master containing the data so that an impression of diffraction gratings of the holographic master is made on the cast polyimide material;
   (b) removing the seamless transfer medium with the impression of the diffraction gratings from the holographic master;
   (c) heat curing the seamless transfer medium; and
   (d) using the seamless transfer medium to emboss the data to another surface.

2. A method of embossing data from a seamless embossing surface to another surfaces, said method comprising the steps of
   (a) spin coating a photodefinable polyimide material on a roller and heat pre-curing a the polyimide material to form said seamless embossing surface of a target thickness;
   (b) cooling said seamless embossing surface to ambient temperature;
   (c) profiling said seamless embossing surface by two interfering laser beams to form diffraction patterns to define said data on said seamless embossing surface;
   (d) wet developing said data on said seamless embossing surface by using a solution;
   (e) heat curing of the seamless embossing surface; and
   (f) embossing said another surfaced with said data by said seamless embossing surface.

3. The method of claim 2, wherein profiling said seamless embossing surface is accomplished in a pixel-by-pixel dot matrix manner.

4. The method of claim 2, wherein heat curing of the seamless embossing surface is done at a temperature selected from a range of about 280° C. to about 400° C.

5. The method of claim 2, wherein heat curing of the seamless embossing surface is done in a nitrogen atmosphere.

6. The method of claim 2, wherein using a solution comprises using an aqueous solution.

7. The method of claim 2, wherein the photodefinable polyimide is a negative acting polyimide.

8. A method of transferring data from a first seamless surface to another surface, said method comprising the steps of:
   (a) spin coating a photodefinable polyimide material on a roller and heat pre-curing a the polyimide material to form said first seamless surface of polyimide;
   (b) cooling said seamless embossing surface to ambient temperature;
   (c) profiling said first surface by two interfering laser beams to define said data on said first seamless surface of polyimide;
   (d) wet developing said data on said first seamless surface with a solution;
   (e) coating said first seamless surface of the polyimide material with a metal and applying ink to said first surface; and
   (f) contacting other surfaces by said first seamless surface to transfer ink corresponding to said data to said another surface.

9. The method of claim 8, wherein profiling said seamless embossing surface is accomplished in a pixel-by-pixel dot matrix manner.

10. The method of claim 8, wherein heat curing of the seamless embossing surface is done at a temperature selected from a range of about 280° C. to about 400° C.

11. The method of claim 8, wherein heat curing of the seamless embossing surface is done in a nitrogen atmosphere.

12. The method of claim 8, wherein using a solution comprises using an aqueous solution.

13. The method of claim 8, wherein the metal comprises Ni or Cr.

14. The method of claim 8, wherein the photodefinable polyimide is a negative acting polyimide.

15. A method of making a seamless profiled surface, the method comprising:

spin coating a roller with a photodefinable polyimide material and heat pre-curing the roller to form a seamless polyimide surface of a target thickness;

cooling the roller to an ambient temperature;

interfering two laser beams on the seamless polyimide surface to profile the seamless polyimide surface with diffractions patterns in a pixel-by-pixel dot matrix manner;

wet developing the seamless polyimide surface on the roller with a solution; and heating the seamless polyimide surface on the roller to harden the surface.

16. The method of claim 15, wherein the photodefinable polyimide material is negative acting.

\* \* \* \* \*